United States Patent [19]

Fukino

[11] Patent Number: 4,951,240
[45] Date of Patent: Aug. 21, 1990

[54] ELECTRONIC PART MOUNTING SYSTEM FOR PRINTED CIRCUIT BOARD

[75] Inventor: Masahiro Fukino, Kamimachiya, Japan

[73] Assignee: Mitsubishi Denki Kabushiki Kaisha, Japan

[21] Appl. No.: 361,726

[22] Filed: Jun. 5, 1989

Related U.S. Application Data

[63] Continuation of Ser. No. 936,255, Dec. 1, 1986, abandoned.

[30] Foreign Application Priority Data

Dec. 2, 1985 [JP] Japan .................. 60-270932

[51] Int. Cl.⁵ .............. G06F 15/20; H05K 3/30; B23P 21/00
[52] U.S. Cl. ................... 364/489; 364/488; 29/744; 29/759
[58] Field of Search ............ 364/488, 489, 490, 491; 29/739, 740, 741, 744, 759, 840, 841

[56] References Cited

U.S. PATENT DOCUMENTS

| 4,096,548 | 6/1978 | Misono et al. | 361/399 |
| 4,520,557 | 6/1985 | Harigana et al. | 29/740 |
| 4,586,251 | 5/1986 | Kinoshita et al. | 29/759 |
| 4,606,117 | 8/1986 | Takahashi et al. | 29/740 |
| 4,619,043 | 10/1986 | Takahashi et al. | 29/840 |
| 4,631,800 | 12/1986 | Ishii et al. | 29/564.6 |
| 4,631,816 | 12/1986 | Fujita et al. | 29/840 X |
| 4,670,979 | 6/1987 | Yoshino et al. | 29/838 |
| 4,670,981 | 6/1987 | Kubota et al. | 29/840 |
| 4,706,379 | 11/1987 | Seno et al. | 29/740 |
| 4,733,462 | 3/1988 | Kawatani | 29/759 |
| 4,739,452 | 4/1988 | Fukunaga | 361/399 |

FOREIGN PATENT DOCUMENTS 244417 10/1986 Japan .

Primary Examiner—Parshotam S. Lall
Assistant Examiner—V. N. Trans
Attorney, Agent, or Firm—Leydig, Voit & Mayer

[57] ABSTRACT

In an electronic part mounting system a printed circuit board is conveyed by a conveyor belt to a predetermined position. The side edges of the printed circuit board are retained by retainers to correct any deformation of the printed circuit board. Consequently, one pair of positioning patterns disposed on the surface of the printed circuit board suffices for the mounting operation of components for the printed circuit board.

5 Claims, 4 Drawing Sheets

ELECTRONIC PART MOUNTING SYSTEM FOR PRINTED CIRCUIT BOARD

This application is a continuation of application Ser. No. 06/936,255, filed Dec. 1, 1986 now abandoned.

BACKGROUND OF THE INVENTION

This invention relates to an electronic part mounting system for a printed circuit board for automatically mounting electronic parts on the printed circuit board.

In order to automatically mount electronic parts on a printed circuit board, the center of the mounting position must be determined on the printed circuit board. A pair of patterns are formed at every mounting position (hereinbelow termed as "a land") of each electronic part on the printed circuit board so as to decide the center of the mounting position.

FIG. 1 shows a prior-art printed circuit board, in which numeral 1 denotes a printed circuit board, numeral 2 denotes lands, numeral 3 denotes patterns, and numeral 4 denotes openings for fastening at a fixed position the printed circuit board. The hatched portions of the lands designate the portions on which the lead wires of electronic parts are to be placed and then electrically connected.

FIG. 2 is an explanatory view showing a prior-art mounting system. Referring to FIG. 2, numeral 5 denotes conveyor belts for carrying the printed circuit board 1 along a guide rail (not shown). The belts are stopped by the operation of an elevational movement type limit switch 6 when the printed circuit board arrives at a predetermined position. Then, elevational movement type projecting rods 7 are projected into the openings of the printed circuit board to fasten the circuit board. Numeral 8 denotes a mounting controller, numeral 9 denotes a pattern recognition camera, numeral 10 denotes an electronic part recognition camera, numeral 11 denotes an attracting head for attracting an electronic part or component 13, and numeral 12 denotes a case for containing the electronic part or component 13. The pattern recognition camera 9 and the attracting head are fastened to one another. X-axis, Y-axis and Z-axis illustrated in the drawing are imaginary coordinate axes set in the mounting controller 8. The coordinate axes are used to move the pattern recognition camera 9 and the attracting head 11 to predetermined coordinate positions.

FIG. 4 is a flowchart for explaining the operating steps of the prior-art mounting system illustrated in FIG. 2, in which numerals 41 to 45 denote the operating steps. More specifically, the pattern recognition camera 9 is operated by the mounting controller 8 in FIG. 2 to read out a pair of patterns 3 provided at both sides of the lands 2 (in step 41). The central position of the land is calculated by calculating means (not shown) in the mounting controller (in step 42). Then, the mounting controller moves the attracting head 11 to pick up one electronic part 13 from the case 12, moves the electronic part recognition camera 10, and allows the camera 10 to recognize the electronic part 13 (in step 43). Next, the central position of the electronic part is calculated by the calculating means in the mounting controller (in step 44). Finally, the mounting controller moves the attracting head 11 to a predetermined land and places the electronic part on the land when the central position of the land coincides with that of the electronic part (in step 45). Thus, the lead wires of the electronic part are placed on predetermined positions of the land (the hatched portions of the land in FIG. 2 which are coated in advance with an adhesive material), and electrically bonded in the next step.

The operations of mounting the electronic parts as described above are sequentially executed each time on electronic part is to be mounted.

FIGS. 3(a), 3(b) and 3(c) are perspective views of a printed circuit board 1 for showing a problem associated therewith. More particularly, the printed circuit board has a small deformation in the longitudinal direction. The figures illustrate the types of the deformations in an enlarged manner. Since the printed circuit board has these deformations, the stopping position of the printed circuit board is slightly at an error. As illustrated in FIG. 1, the pair of patterns 3 must be provided for each land 2. Thus, it is necessary in the prior-art system to provide the step of reading out the pattern for each land when mounting the electronic part. The mounting process has such drawbacks as a long time requirement for mounting the components, thereby reducing the system's efficiency.

SUMMARY OF THE INVENTION

This invention provides a novel electronic part mounting system which improves the drawbacks of the above-described prior-art electronic part mounting system. More particularly, in the electronic part mounting system according to the present invention, the deformation of a printed circuit board is corrected before an electronic part is mounted. Thus, the pattern to be provided on a printed circuit board may sufficiently involve only a pair of patterns for one printed circuit board. Therefore, since it is not necessary to provide the patterns for each of the respective lands, the efficiency of the mounting system can be largely improved.

BRIEF DESCRIPTION OF THE DRAWINGS

In the drawings, the same symbols indicate the same or equivalent parts.

DESCRIPTION OF THE PREFERRED EMBODIMENT

Figure 5:
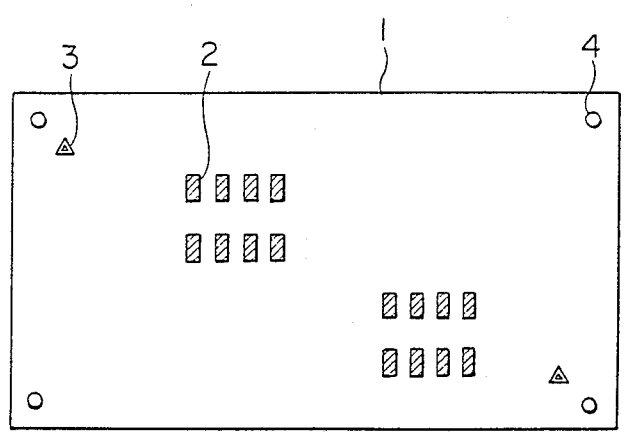
FIG. 5 is a front view of an electronic part mounting system for a printed circuit board according to the present invention.

FIG. 5 is a front view of a printed circuit board used in an electronic part mounting system according to the present invention. As is obvious from FIG. 5, only a pair of patterns 3 are provided for a printed circuit board 1, and no pairs of patterns are provided for respective lands 2.

Figure 6:
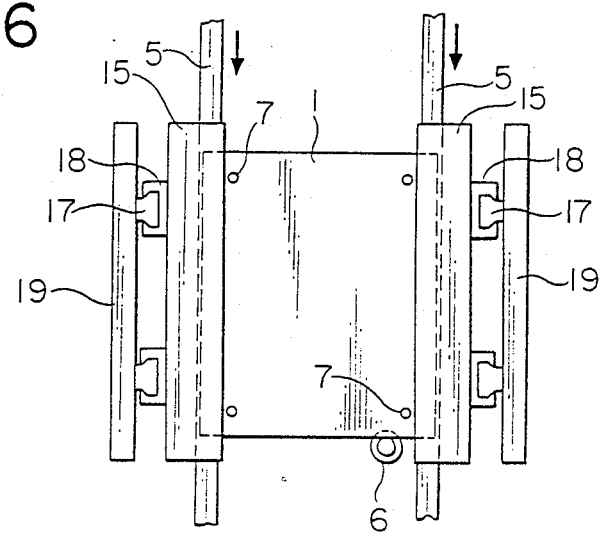
FIG. 6 is a plan view of holding means for holding both side edges of the printed circuit board by pressing the circuit board according to the present invention.
Figure 7:
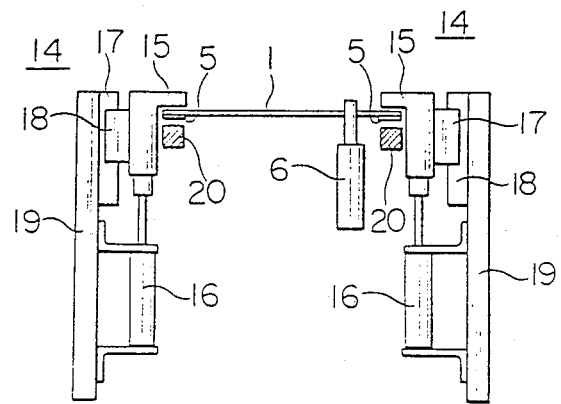
FIG. 7 is a side view of the holding means.

FIGS. 6 and 7 are plan and side views of holding means according to the present invention. In the figures, numeral 14 generally denotes holding means, numeral 15 denotes retainers for retaining the edges of the printed circuit board, numeral 16 denotes electromagnetic units for elevationally moving upward and downward the retainers 15, numeral 17 denotes slide units fastened to the respective retainers, numeral 18 denotes movable guide units engaged with the slide units, numeral 19 denotes supporting units for supporting the electromagnetic units 16 and the movable guide units 17, and numeral 20 denotes guide rails for guiding the movements of belts 5.

The belts 5 convey the printed circuit board 1, and are automatically stopped by a limit unit 6 when the printed circuit board arrives at a predetermined position. When the belts 5 stop, elevational movement type projecting rods 7 are projected to be engaged with the openings 4 of the printed circuit board 1, the electromagnetic units 16 are operated to move downward the retainers 15 to retain the both side edges of the printed circuit board 1, thereby holding the printed circuit board. Thereafter, the electronic part 13 is mounted on the printed circuit board 1 in the same working steps as described with respect to FIG. 2. In this case, since the printed circuit board 1 is held by the holding means 14 in the state that the side edges of the printed circuit boards are flatly held by the holding means 14, the coordinates of the central positions of the lands 2 can be determined by a common pattern. Therefore, it is not necessary to decide the pattern at every land. In other words, only a pair of patterns may be sufficiently provided for one printed circuit board.

Figure 1:
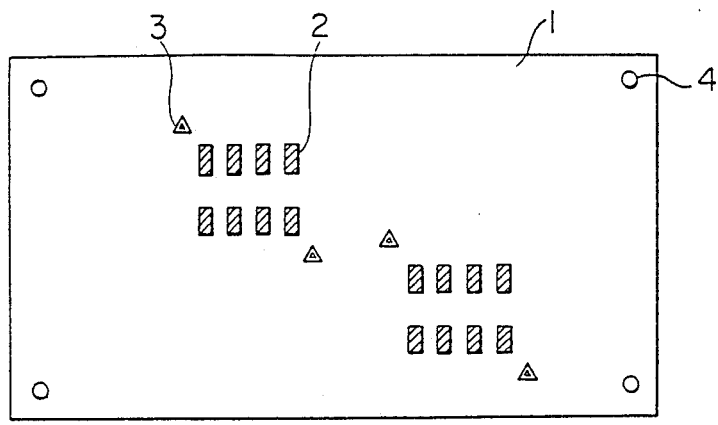
FIG. 1 is a front view of a printed circuit board of a prior-art electronic part mounting system for the printed circuit board.
Figure 2:
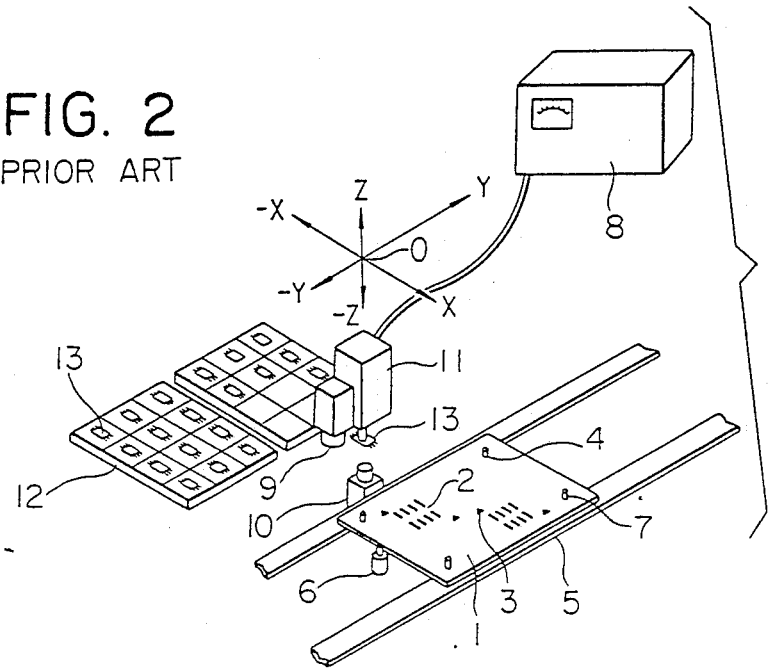
FIG. 2 is an explanatory view for explaining the mounting operation of an electronic part.
Figure 3A:
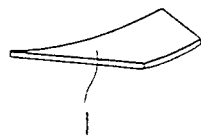
FIG. 3(a), 3(b) and 3(c) are perspective views of deformed printed circuit boards.
Figure 3B:
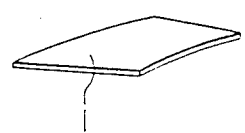
Figure 3C:
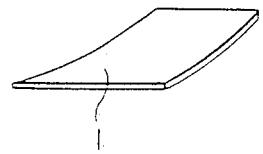
Figure 4:
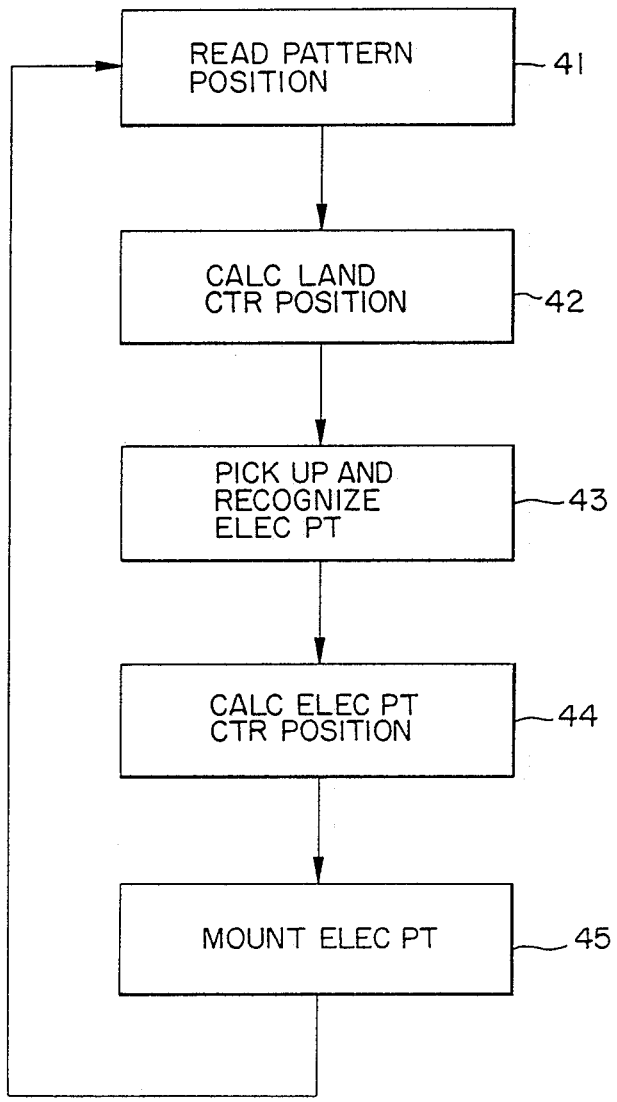
FIG. 4 is a flowchart illustrating the steps of mounting the electronic part in the prior-art system.
Figure 8:
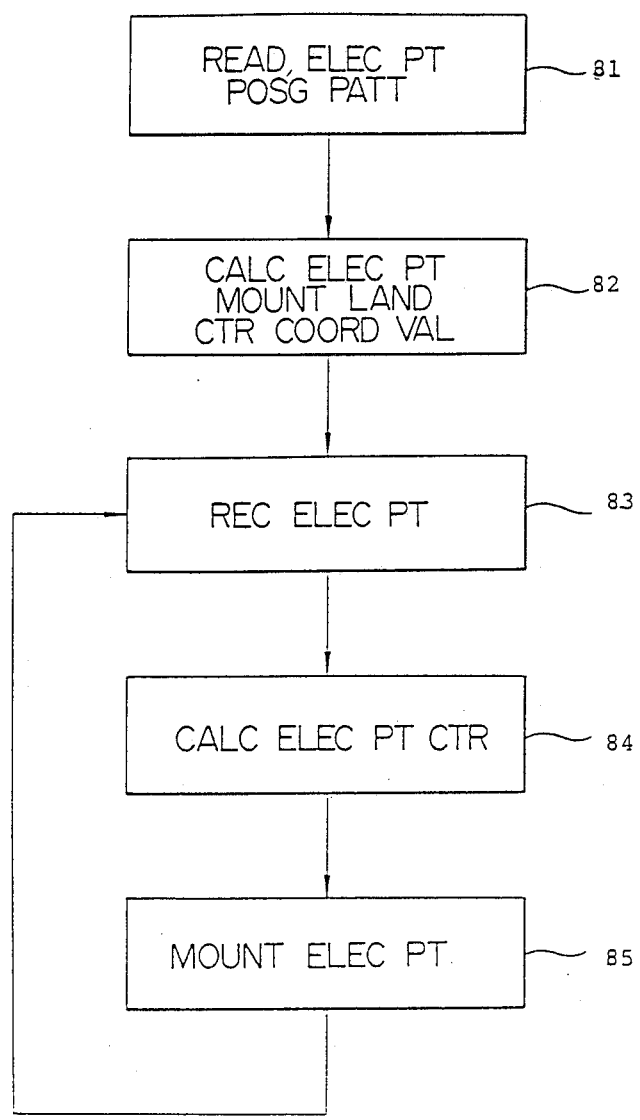
FIG. 8 is a flowchart illustrating the steps of the mounting operation.

FIG. 8 is a flowchart illustrating the operating steps of the mounting system according to the present invention, in which numerals 81 to 85 denote the steps corresponding to the steps 41 to 45 of FIG. 2. As apparent from FIG. 8, in the electronic part mounting system according to the present invention, the reading step of a pair of patterns may be carried out only once for one printed circuit board. Therefore, the operating steps can be simplified as compared with the case that the patterns must be read out at every land as in the prior-art mounting system shown in FIG. 4.

Since the reading of the patterns may be carried out only once for one printed circuit board in the electronic part mounting system according to the present invention as described above, the operating efficiently can be largely improved as compared with the conventional mounting system.

What is claimed is:

1. An electronic part mounting system for a printed circuit board comprising:
a pair of electronic part positioning patterns provided on a printed circuit board commonly for a plurality of mounting lands for electronic parts provided on the printed circuit board,
a conveyor belt for conveying the printed circuit board,
a guide rail disposed under the conveyor belt;
stopping means having a limit switch for stopping said conveyor belt when the printed circuit board arrives at a predetermined position over the guide rail,
a pattern recognition camera mounted adjacent to the predetermined position for reading said pair of electronic parts positioning patterns on the printed circuit board,
position fastening holding means having elevational movement projection rods to be engaged with openings formed in the printed circuit board when said conveyor belt is stopped, and a retainer means for retaining and flatly holding side edges of the printed circuit board at sides of the belt against the guide rail during the stopping time,
first calculating means for calculating central point positions of each of the plurality of mounting lands on the printed circuit board based on said pair of electronic part positioning patterns read by said pattern recognition camera using coordinate axes set in advance as a base,
second calculating means for calculating central point positions of the electronic parts picked up from a case containing electronic parts, and
mounting control means for placing each of the electronic parts on the lands when the central point of each electronic part coincides with that of a respective one of the mounting lands as the electronic part is conveyed above the printed circuit board.

2. An electronic part mounting system for a printed circuit board as defined in claim 1 wherein said retainer of said position fastening holding means comprises a pair of retainers which hold or release respective side edges of the printed circuit board, and further comprising electromagnetic units coupled to said holding means for elevationally moving upwardly or downwardly said pair of retainers.

3. An electronic part mounting system for a printed circuit board comprising:
a pair of electronic part positioning patterns provided on a printed circuit board commonly for a plurality of mounting lands for electronic parts provided on the printed circuit board,
a conveyor belt for conveying the printed circuit board,
a guide rail disposed substantially parallel to said conveyor belt,
stopping means having a limit switch for stopping said conveyor belt when the printed circuit board arrives at a predetermined position,
a pair of retainers cooperatively arranged with said guide rail on opposite sides of the predetermined position,
means for elevationally moving said retainers toward said guide rail to retain and flatly hold the printed circuit board against said guide rail and away from said guide rail to release the printed circuit board,
pattern recognizing means for recognizing the positions of said pair of electronic part positioning patterns on the printed circuit board,
first calculating means for calculating the central point position of each of the mounting lands on the printed circuit board from the recognized positions of said pair of electronic part positioning patterns using coordinate axes set in advance as a base,
second calculating means for calculating central point positions of the electronic parts picked up from a case containing electronic parts, and
mounted control means for placing each of the electronic parts on the lands when the central point position of each electronic part coincides with that of a respective one of the mounting lands as the electronic part is conveyed above the printed circuit board.

4. An electronic part mounting system as set forth in claim 3 further comprising projecting rods mounted to align with openings formed in the printed circuit board when the printed circuit board is in the predetermined position.

5. An electronic part mounting system for a printed circuit board having a plurality of mounting lands and a pair of electronic part positioning patterns disposed thereon, the system comprising:

a conveyor belt for conveying the printed circuit board, stopping means for stopping said conveyor belt when the printed circuit board arrives at a predetermined position, a retainer mounted near the predetermined position, means for actuating said retainer to flatly retain the printed circuit board when the printed circuit board arrives at the predetermined position, pattern recognizing means for recognizing the position of the pair of electronic part positioning patterns on the printed circuit board while said actuating means flatly retains the printed circuit board, first calculating means for calculating the central point position of each of the mounting lands on the printed circuit board from the recognized positions of the pair of electronic part positioning patterns, second calculating means for calculating the central point position of each of the electronic parts picked up from a case containing electronic parts, and mounting control means for placing each of the electronic parts on the lands when the central point position of each electronic part coincides with the central point position of a respective one of the mounting lands as the electronic part is conveyed above the printed circuit board while said actuating means flatly retains the printed circuit board, said actuating means including means for actuating said retainer to release the printed circuit board after all of the electronic parts are mounted.

* * * * *